(12) United States Patent
Zhu et al.

(10) Patent No.: US 7,670,932 B2
(45) Date of Patent: Mar. 2, 2010

(54) MOS STRUCTURES WITH CONTACT PROJECTIONS FOR LOWER CONTACT RESISTANCE AND METHODS FOR FABRICATING THE SAME

(75) Inventors: Jianhong Zhu, Austin, TX (US); Fred Hause, Austin, TX (US); David Wu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 48 days.

(21) Appl. No.: 11/762,133

(22) Filed: Jun. 13, 2007

(65) Prior Publication Data

US 2008/0308879 A1    Dec. 18, 2008

(51) Int. Cl.
*C12N 15/75* (2006.01)
(52) U.S. Cl. .................. 438/481; 438/595
(58) Field of Classification Search .......... 257/377, 257/382, 383, 384, E29.116, E29.117, E21.058, 257/E21.438, E21.634; 438/300, 301, 481, 438/241, 595
See application file for complete search history.

(56) References Cited

U.S. PATENT DOCUMENTS

| 6,004,879 | A | * | 12/1999 | Hu et al. ............... 438/682 |
| 6,344,388 | B1 | * | 2/2002 | Oishi et al. ............ 438/241 |
| 2006/0131648 | A1 | * | 6/2006 | Ahn et al. ............. 257/347 |

* cited by examiner

*Primary Examiner*—Minh-Loan T Tran
*Assistant Examiner*—Vongsavanh Sengdara
(74) *Attorney, Agent, or Firm*—Ingrassia Fisher & Lorenz, P.C.

(57) ABSTRACT

MOS structures with contact projections for lower contact resistance and methods for fabricating such MOS structures have been provided. In an embodiment, a method comprises providing a semiconductor substrate, fabricating a gate stack on the substrate, and forming a contact projection on the substrate. Ions of a conductivity-determining type are implanted within the substrate using the gate stack as an ion implantation mask to form impurity-doped regions within the substrate. A metal silicide layer is formed on the contact projection and a contact is formed to the metal silicide layer. The contact is in electrical communication with the impurity-doped regions via the contact projection.

18 Claims, 11 Drawing Sheets

US 7,670,932 B2

MOS STRUCTURES WITH CONTACT PROJECTIONS FOR LOWER CONTACT RESISTANCE AND METHODS FOR FABRICATING THE SAME

FIELD OF THE INVENTION

The present invention generally relates to MOS structures and methods for fabricating MOS structures, and more particularly relates to MOS structures with contact projections for lower contact resistance and methods for fabricating such MOS structures.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode.

The MOS transistor is accessed via a conductive contact typically formed on the source/drain regions between the gate electrodes of two MOS transistors. The conductive contact is usually formed by depositing an insulating layer over the source/drain regions and etching a contact opening in the insulating layer. A thin barrier layer, typically of titanium nitride and/or other metals and alloys, is deposited in the contact opening and the opening then is filled by a chemical vapor deposited layer of tungsten.

There is a continuing trend to incorporate more and more circuitry on a single IC chip. To incorporate the increasing amount of circuitry, the size of each individual device in the circuit and the size and spacing between device elements must decrease. However, one of the limiting factors in the continued shrinking of integrated semiconductor devices is the resistance of contacts to doped regions such as the source and drain regions of an MOS transistor. As device sizes decrease, the width of the contact decreases. As the width of the contact decreases, the resistance of the contact becomes increasingly larger. In turn, as the resistance of the contact increases, the drive current of the device decreases, thus adversely affecting device performance.

Accordingly, it is desirable to provide MOS structures that exhibit lower contact resistance. In addition, it is desirable to provide methods for fabricating MOS structures that exhibit lower contact resistance. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating an MOS structure in accordance with an exemplary embodiment of the present invention is provided. The method comprises providing a semiconductor substrate, fabricating a gate stack on the semiconductor substrate, and forming a contact projection on the semiconductor substrate. Ions of a conductivity-determining type are implanted within the semiconductor substrate using the gate stack as an ion implantation mask to form impurity-doped regions within the semiconductor substrate. A metal silicide layer is formed on the contact projection and a contact is formed to the metal silicide layer. The contact is in electrical communication with the impurity-doped regions via the contact projection.

A method for fabricating an MOS structure in accordance with another exemplary embodiment of the present invention is provided. The method comprises providing a silicon substrate, forming a gate stack on the silicon substrate, and fabricating a contact projection on a surface of the silicon substrate. A metal silicide is formed on the contact projection. A dielectric material is deposited overlying the contact projection and a contact opening is etched through the dielectric material to the metal silicide on the contact projection. A contact is formed in the contact opening on the metal silicide. An interface between the metal silicide and the contact is greater than an interface between the metal silicide and the contact if the contact projection were absent.

An MOS structure in accordance with another exemplary embodiment of the present invention is provided. The MOS structure comprises a semiconductor substrate, an MOS transistor formed on and within the semiconductor substrate, and a contact projection projecting from a surface of the semiconductor substrate. A metal silicide layer overlies the contact projection and a dielectric material overlies the MOS transistor. A contact extends through the dielectric material to the metal silicide layer overlying the contact projection. The contact is in electrical communication with the MOS transistor through the contact projection.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 14:
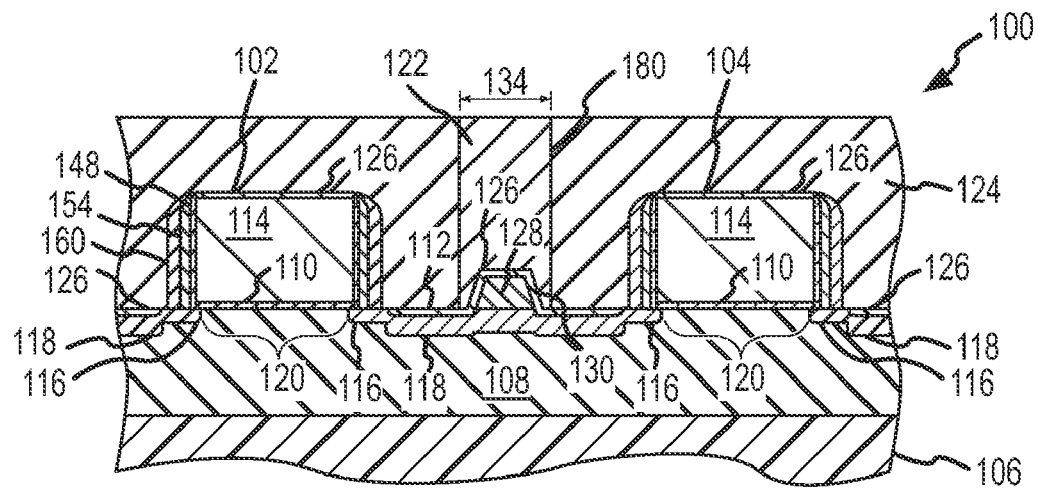

FIG. 14 is a cross-sectional view of an MOS structure 100 in accordance with an exemplary embodiment of the present invention. MOS structure 100 is illustrated having a first MOS transistor 102 and a second MOS transistor 104. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors 102 and 104 can be PMOS transistors or NMOS transistors. While semiconductor device 100 is illustrated with only two MOS transistors, it will be appreciated that semiconductor device 100 may have any number of NMOS transistors and/or PMOS transistors. Those of skill in the art will appreciate that device 100 may include a large number of such transistors as required to implement a desired circuit function.

MOS transistors 102 and 104 are fabricated on a semiconductor substrate 106 which can be either a bulk silicon wafer as illustrated or a thin silicon layer on an insulating substrate (SOI). At least a portion 108 of the semiconductor substrate 106 is doped with P-type conductivity-determining impurities for the fabrication of an NMOS transistor or with N-type conductivity-determining impurities for the fabrication of a PMOS transistor. Portion 108 can be impurity doped, for example, by the implantation and subsequent thermal annealing of dopant ions such as boron or arsenic.

MOS transistors 102 and 104 each include a gate insulator 110 formed at a surface 112 of the semiconductor substrate 106. A gate electrode 114 overlies the gate insulator 110. The gate electrode 114 may be formed of polycrystalline silicon or other conductive material such as metal. Source and drain extensions 116 and deeper source and drain regions 118 are disposed within silicon substrate 106 and are separated by a channel region 120 disposed below the gates electrode 114 within the silicon substrate 106.

Figure 32:
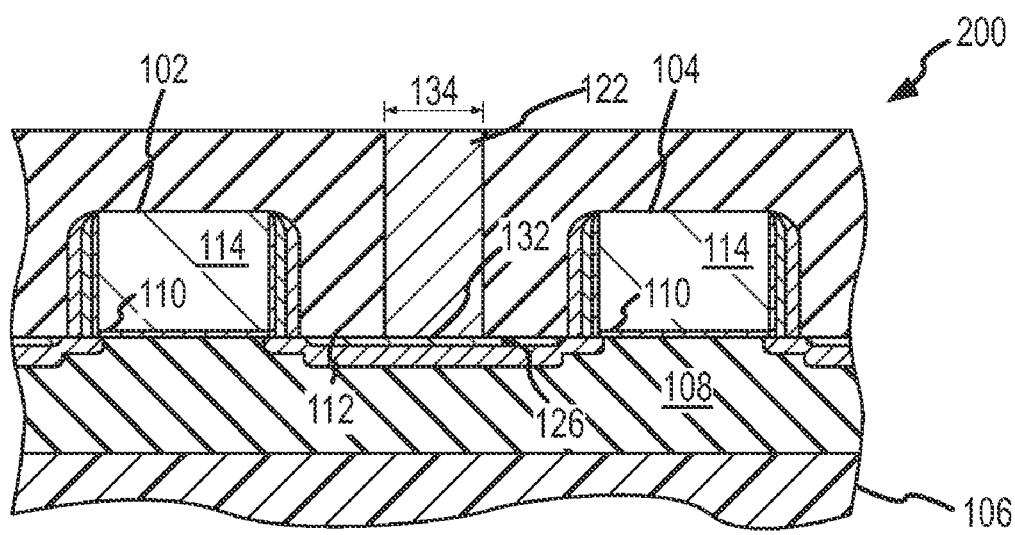
FIG. 32 is a cross-sectional view of a conventional MOS structure having two MOS transistors and a conductive contact in electrical communication therewith.

MOS structure 100 also comprises a conductive contact 122 that is formed within a dielectric layer 124 that overlies MOS transistors 102 and 104. The conductive contact 122 is disposed on and is in electrical communication with a metal silicide layer 126 that is disposed, at least partially, on a contact projection 128. Contact projection 128 is disposed on surface 112 of substrate 106. The contact projection 128 projects or extends from surface 112 and may assume a cross-sectional shape such as, for example, a square or a rectangle or may have a tapered or rounded shape such as an "ant hill" shape. FIG. 32 is a cross-sectional view of a conventional MOS structure with metal silicide layer 126 formed on surface 112 of semiconductor substrate 106. Referring momentarily to FIGS. 14 and 32, although a width of contact 122, illustrated by double-headed arrow 134, may be small, contact projection 128, and metal silicide layer 126 disposed thereon, provide an interface 130 with contact 122 (FIG. 14) that is greater than an interface 132 of that portion of surface 112 of substrate 106 upon which metal silicide layer 126 lies with projection 128 absent (FIG. 32). The increase in the surface area of the interface results in a decrease in contact resistance between the conductive contact 122 and the source/drain regions 118 and, thus, an increase in device performance.

FIGS. 1-14 illustrate, in cross section, a method for forming an MOS structure, such as MOS structure 100 of FIG. 14, in accordance with an exemplary embodiment of the invention. Various steps in the manufacture of MOS components are well known and so, in the interest of brevity, many conventional steps will only be mentioned briefly herein or will be omitted entirely without providing the well known process details.

Figure 1:
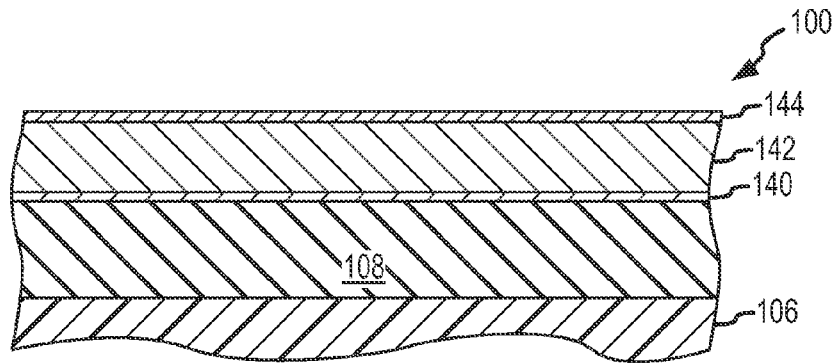
FIGS. 1-14 illustrate, in cross section, a method for fabricating an MOS structure in accordance with an exemplary embodiment of the present invention.

Referring to FIG. 1, the method begins by forming a gate insulator material 140 overlying a semiconductor substrate 106. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The semiconductor substrate will hereinafter be referred to for convenience, but without limitation, as a silicon substrate. The silicon substrate may be a bulk silicon wafer, or may be a thin layer of silicon on an insulating layer (commonly know as silicon-on-insulator or SOI) that, in turn, is supported by a carrier wafer. At least a surface 108 of the silicon substrate is impurity doped, for example by forming N-type well regions and P-type well regions for the fabrication of P-channel (PMOS) transistors and N-channel (NMOS) transistors, respectively.

In the conventional processing, the layer 140 of gate insulating material can be a layer of thermally grown silicon dioxide or, alternatively (as illustrated), a deposited insulator such as a silicon oxide, silicon nitride, or the like. Deposited insulators can be deposited, for example, by chemical vapor deposition (CVD), low pressure chemical vapor deposition (LPCVD), or plasma enhanced chemical vapor deposition (PECVD). Gate insulator layer 140 preferably has a thickness of about 1-10 nm, although the actual thickness can be determined based on the application of the transistor in the circuit being implemented.

A layer of gate electrode material 142 is formed overlying the gate insulating material 140. In accordance with one embodiment of the invention, the gate electrode material is polycrystalline silicon. The layer of polycrystalline silicon is preferably deposited as undoped polycrystalline silicon and is subsequently impurity doped by ion implantation. The polycrystalline silicon can be deposited by LPCVD by the hydrogen reduction of silane. A layer of hard mask material 144, such as silicon nitride or silicon oxynitride, can be deposited onto the surface of the polycrystalline silicon. The hard mask material can be deposited to a thickness of about 50 nm, also by LPCVD. Alternatively, it will be appreciated that a photoresist may be deposited onto the surface of the polycrystalline silicon instead of the hard mask material.

Figure 2:
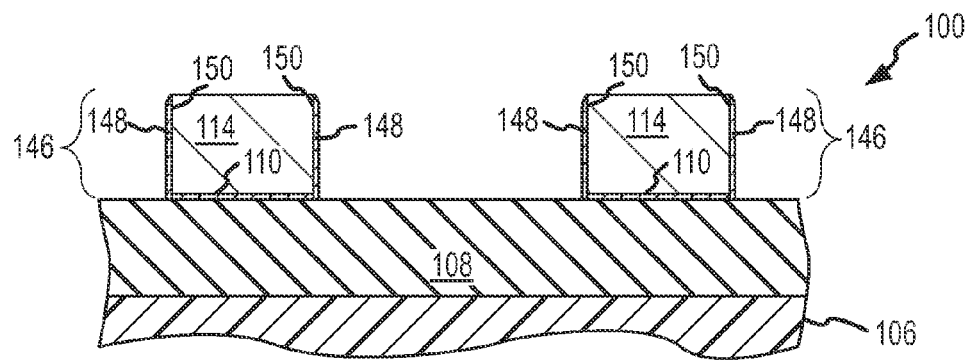

The hard mask layer 144 is photolithographically patterned and the underlying gate electrode material layer 142 and the gate insulating material layer 140 are etched to form gate stacks 146, each having a gate insulator 110 and a gate electrode 114, as illustrated in FIG. 2. The polycrystalline silicon can be etched in the desired pattern by, for example, reactive ion etching (RIE) using a Cl⁻ or HBr/$O_2$ chemistry and the hard mask and gate insulating material can be etched, for example, by RIE in a $CHF_3$, $CF_4$, or $SF_6$ chemistry. Reoxidation sidewall spacers 148 are formed about sidewalls 150 of gate stacks 146 by subjecting the gate electrodes 114 to high temperature in an oxidizing ambient. The reoxidation sidewall spacers 148 have a thickness of, for example, about 3 to 4 nm.

Figure 3:
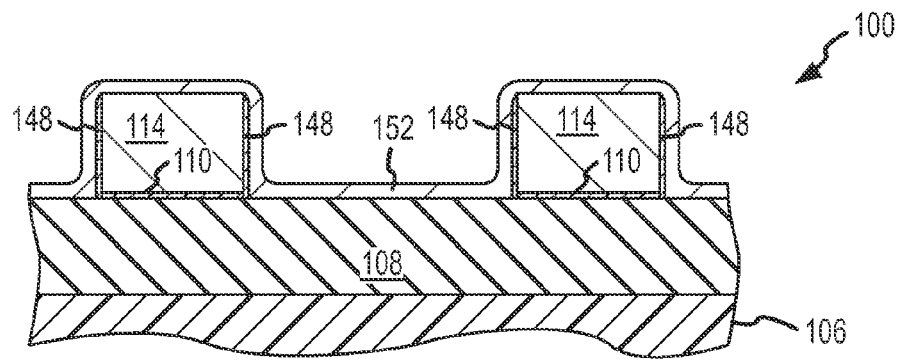
Figure 4:
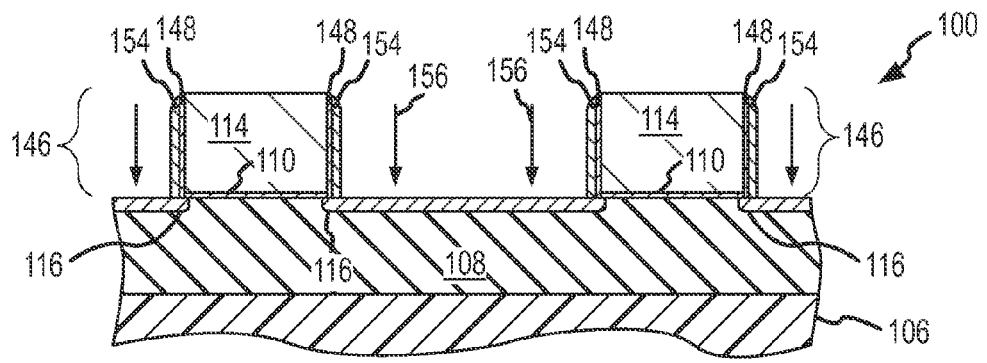

After the formation of the reoxidation sidewall spacers 148, a blanket layer 152 of dielectric material is deposited overlying MOS structure 100, as illustrated in FIG. 3. The dielectric material layer may comprise, for example, silicon dioxide. The dielectric material layer 152 is anisotropically etched, as described above, to form second spacers 154, often referred to as offset spacers, adjacent to the reoxidation sidewall spacers 148, as illustrated in FIG. 4. The offset spacers have a thickness of, for example, about 10 to about 20 nm. The reoxidation spacers 148 and the offset spacers 154 are used along with the gate stacks 146 as an ion implantation mask for formation of source and drain extensions 116. By using the gate stacks 146 and the spacers 148 and 154 as an ion implantation mask, the source and drain extensions are self aligned with the gate stacks and the spacers. The source and drain extensions are formed by appropriately impurity doping silicon substrate 106 in known manner, for example, by ion implantation of dopant ions, illustrated by arrows 156, and subsequent thermal annealing. For an N-channel MOS transistor the source and drain extensions 116 are preferably formed by implanting arsenic ions, although phosphorus ions could also be used. For a P-channel MOS transistor, the source and drain extensions are preferably formed by implanting boron ions.

Figure 5:
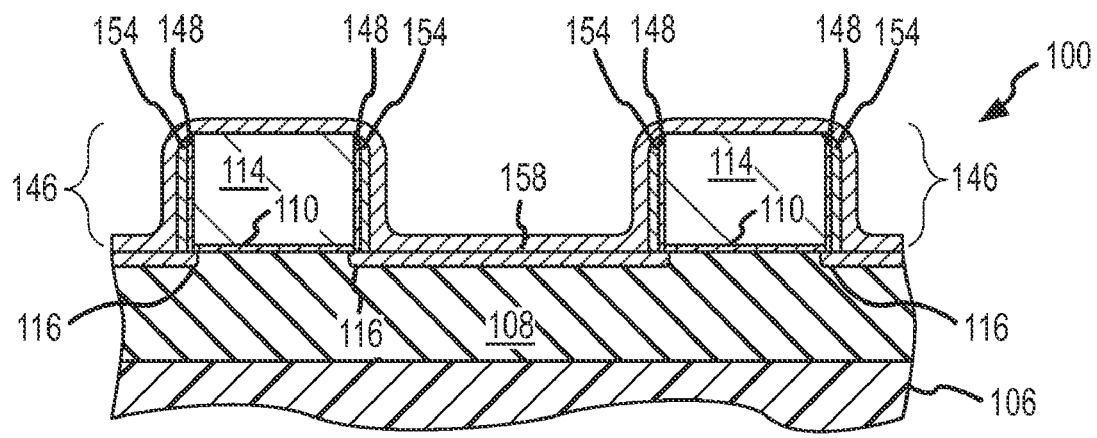
Figure 6:
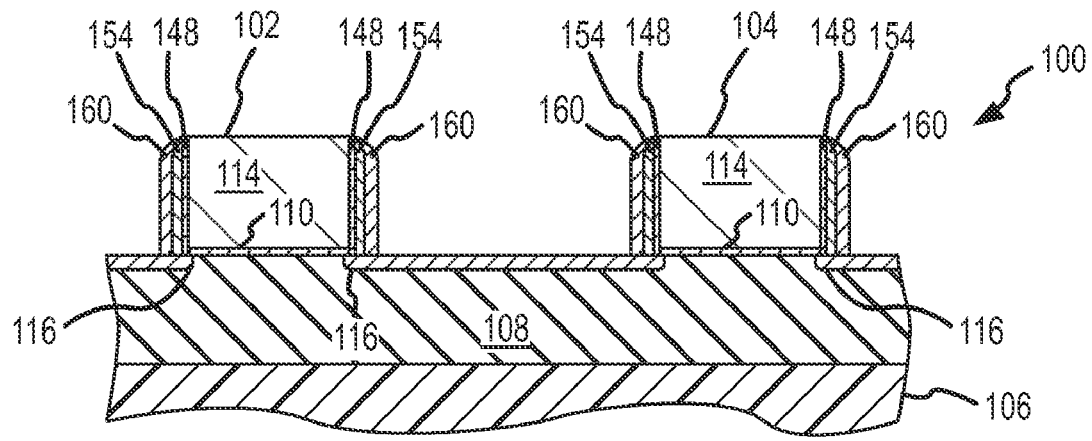

Referring to FIG. 5, a blanket layer 158 of dielectric material such as, for example, silicon nitride or silicon oxynitride, is deposited overlying MOS structure 100. The layer 158 of dielectric material is subsequently anisotropically etched, for example by RIE using, for example, a $CHF_3$, $CF_4$, or $SF_6$ chemistry, to form additional spacers 160 disposed adjacent offset spacers 154, as illustrated in FIG. 6. Although gate stacks 146 are illustrated with reoxidation sidewall spacers 148, offset spacers 154, and additional spacers 160, it will be appreciated that gate stacks 146 may have any number of spacers with any composition that is suitable for a desired circuit application or design.

Figure 7:
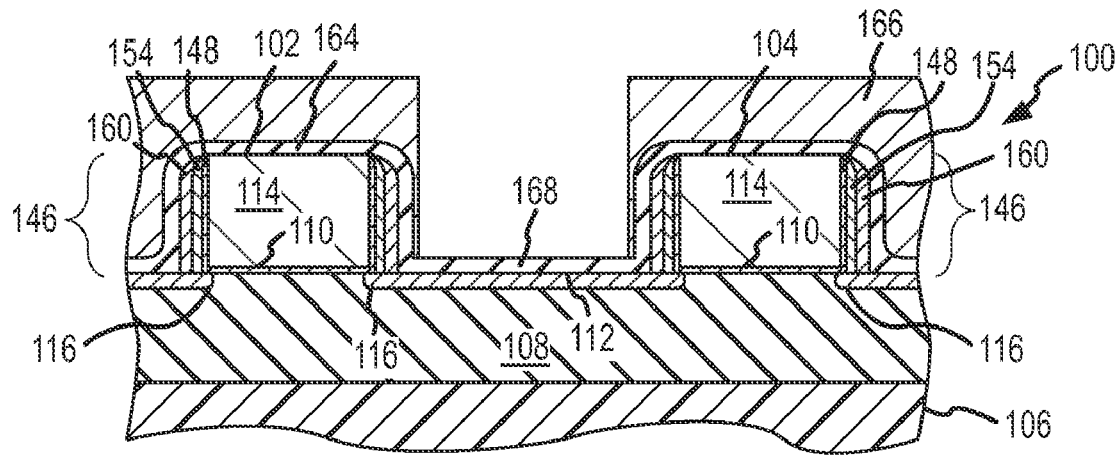
Figure 8:
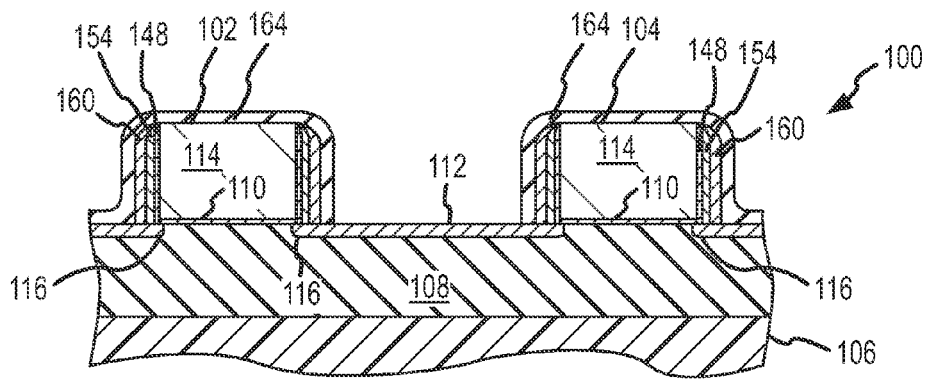

Referring to FIG. 7, a blanket dielectric material layer 164, preferably a silicon dioxide layer, is deposited overlying MOS structure 100. The dielectric material layer 164 is deposited to a thickness of, for example, about 20 to 50 nm. A layer of photoresist 166 is applied and patterned to mask gate stacks 146 and expose a portion 168 of dielectric material layer 164 that is disposed on surface 112 of semiconductor substrate 106 and that overlies source and drain extensions 116. The exposed portion 168 of dielectric material layer 164 then is removed such as by etching, for example, by RIE in a $CHF_3$, $CF_4$, or $SF_6$ chemistry to expose surface 112 of semiconductor substrate 106, as illustrated in FIG. 8. The photoresist then can be removed by conventional methods.

Figure 9:
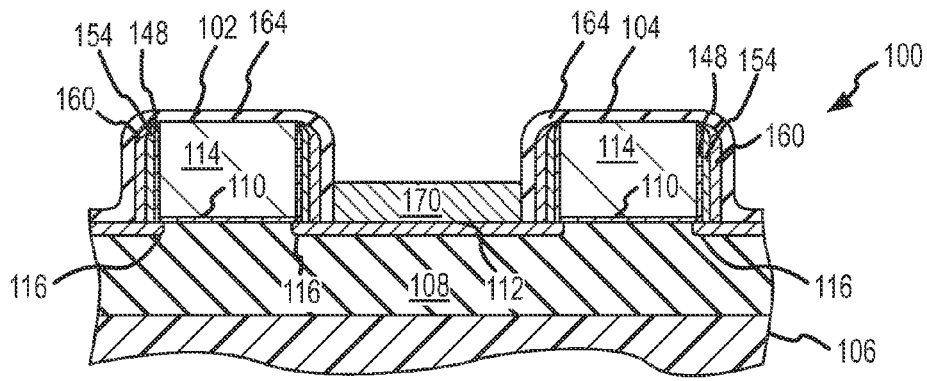
Figure 10:
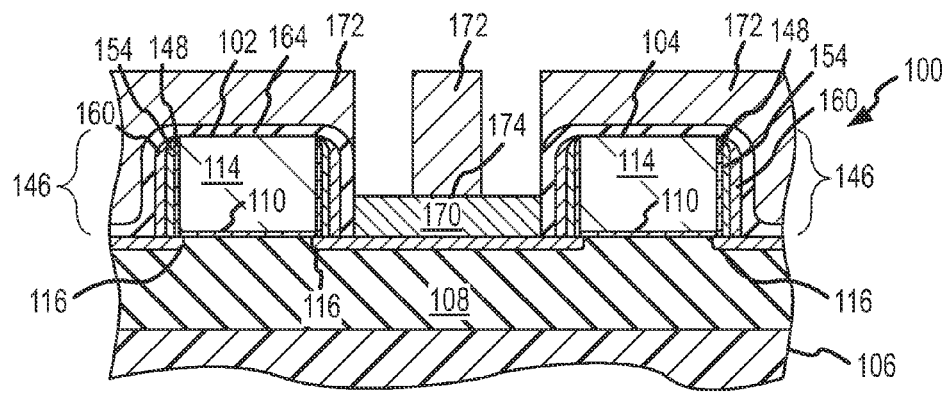

The method continues, in accordance with an exemplary embodiment of the present invention, with the epitaxial growth of a silicon layer 170 on the exposed silicon surface 112, as illustrated in FIG. 9. The epitaxial silicon layer 170 can be grown by the reduction of silane ($SiH_4$) or dichlorosilane ($SiH_2Cl_2$) in the presence of HCl. The presence of the chlorine source promotes the selective nature of the growth, that is, the growth of the epitaxial silicon preferentially on the exposed silicon surface 112 as opposed to on the silicon dioxide 164. The epitaxial silicon layer 170 can be grown to any thickness desired for a particular device design or application. In an exemplary embodiment, the epitaxial silicon layer 170 is grown to a thickness in the range of about 30 nm to about 50 nm. Referring to FIG. 10, a photoresist 172 is applied and patterned to mask the gate stacks 146 and a portion 174 of epitaxial silicon layer 170.

Figure 11:
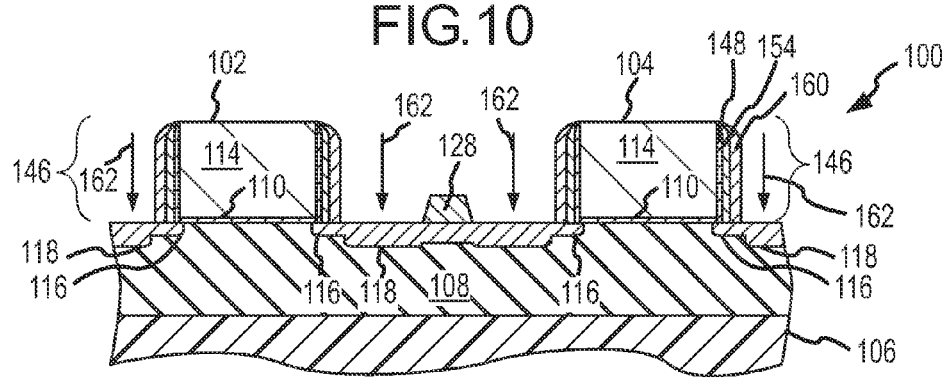

Exposed portions of epitaxial silicon layer 170 then are etched to form a contact projection 128 that extends from surface 112 of semiconductor substrate 106, as illustrated in FIG. 11. The epitaxial silicon layer is anisotropically etched, for example by reactive ion etching using a $HBr/O_2$ and Cl chemistry. After removal of the photoresist 172, dielectric material layer 164 is also removed using a suitable etch process selective to layer 164. Next, gate stacks 146, the reoxidation sidewall spacers, the offset spacers 154, and additional spacers 160 are used as an ion implantation mask to form source and drain regions 118 in silicon substrate 106, thus forming MOS transistors 102 and 104. The source and drain regions are formed by appropriately impurity doping silicon substrate 106 in known manner, for example, by ion implantation of dopant ions, illustrated by arrows 162, and subsequent thermal annealing. For an N-channel MOS transistor, the source and drain regions 118 are preferably formed by implanting arsenic ions, although phosphorus ions could also be used. For a P-channel MOS transistor, the source and drain regions 118 are preferably formed by implanting boron ions. During formation of the source and drain regions 118, contact projection 128 also is impurity doped by implantation of dopant ions 162 and is doped with the same concentration of dopant ions as the source and drain regions 118.

Figure 12:
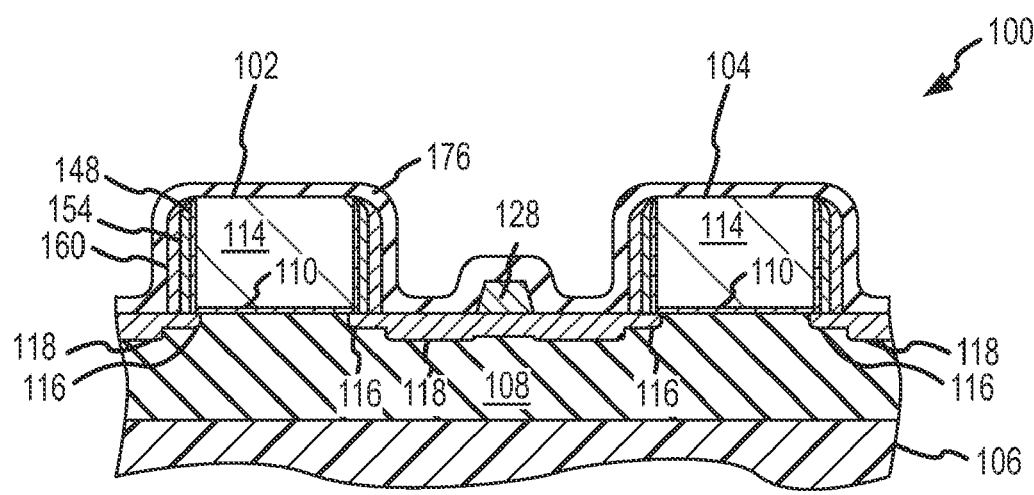
Figure 13:
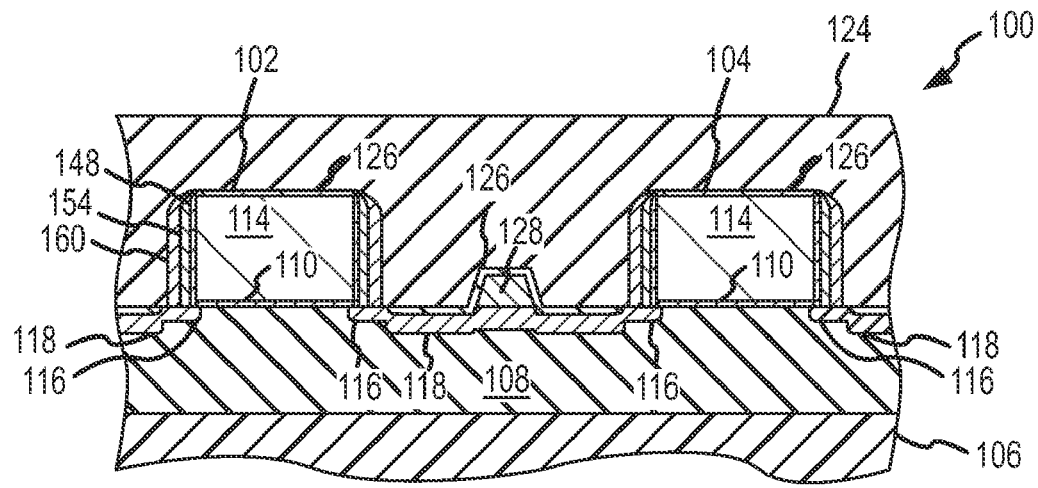

Referring to FIG. 12, a blanket layer 176 of silicide-forming metal is deposited overlying MOS structure 100. The silicide-forming metal layer 176 is heated, for example by RTA, to form a metal silicide layer 126 on contact projection 128 and on surface 112 of substrate 106, as well as metal silicide layers 126 on gate electrodes 114, as illustrated in FIG. 13. In an alternative embodiment, the hard mask used to form gate stack 146 as illustrated in FIG. 2 is not removed after formation of the gate stacks so that formation of a metal silicide layer on the gate electrodes is prevented. The silicide-forming metal can be, for example, cobalt, nickel, rhenium, ruthenium, or palladium, or alloys thereof. The silicide-forming metal can be deposited, for example, by sputtering to a thickness of about 5-50 nm and preferably to a thickness of about 10 nm. Any silicide-forming metal that is not in contact with exposed silicon, for example the silicide-forming metal that is deposited on additional spacer 160, does not react during the RTA to form a silicide and may subsequently be removed by wet etching in a $H_2O_2/H_2SO_4$ or $HNO_3/HCl$ solution. After forming the metal silicide layers, a layer of dielectric material 124 is deposited overlying MOS transistors 102 and 104 and contact projection 128.

The method continues, in accordance with an exemplary embodiment of the invention, with the patterning and etching of the dielectric material layer 124 to form a contact opening 180 extending through dielectric material layer 124 and exposing at least a portion of metal silicide layer 126 on contact projection 128, as illustrated in FIG. 14. The dielectric material layer may be planarized by a CMP process before patterning. Conductive contact 122 is formed in contact opening 180 so that the source and drain regions can be appropriately connected electrically to other devices in the integrated circuit to implement the desired circuit function. In an exemplary embodiment of the present invention, conductive contact 122 is formed by the deposition of a thin first barrier layer, such as, for example, TiN (not shown), and a thin second barrier layer (not shown), such as, for example, titanium, within contact opening 180, followed by the deposition of a conductive plug (not shown), such as, for example, W. The barrier layers are used to prevent diffusion of tungsten hexafluoride $WF_6$, used during formation of the conductive plug, into the dielectric material layer 124 and to enhance adhesion of the conductive plug to the walls of the contact opening. It will be appreciated that other layers may be utilized to form conductive contact 122. For example, a layer of tantalum may be deposited before the barrier layer is formed.

FIGS. 15-22 illustrate, in cross section, a method for forming an MOS structure, such as MOS structure 100 of FIG. 14, in accordance with another exemplary embodiment of the invention. The method illustrated in FIGS. 15-22 is similar to the method illustrated in FIGS. 1-14, although the method illustrated in FIGS. 15-22 does not require the step of etching the epitaxially-grown silicon.

Figure 15:
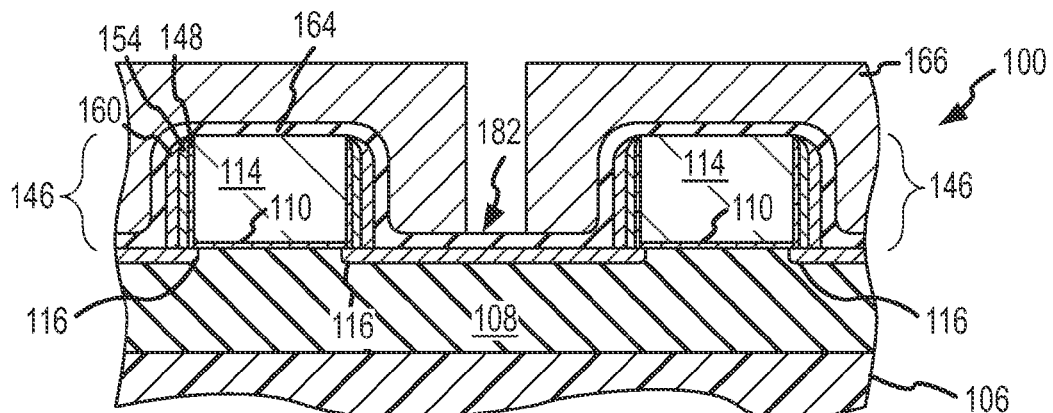
FIGS. 15-22 illustrate, in cross section, a method for fabricating an MOS structure in accordance with another exemplary embodiment of the present invention.
Figure 16:
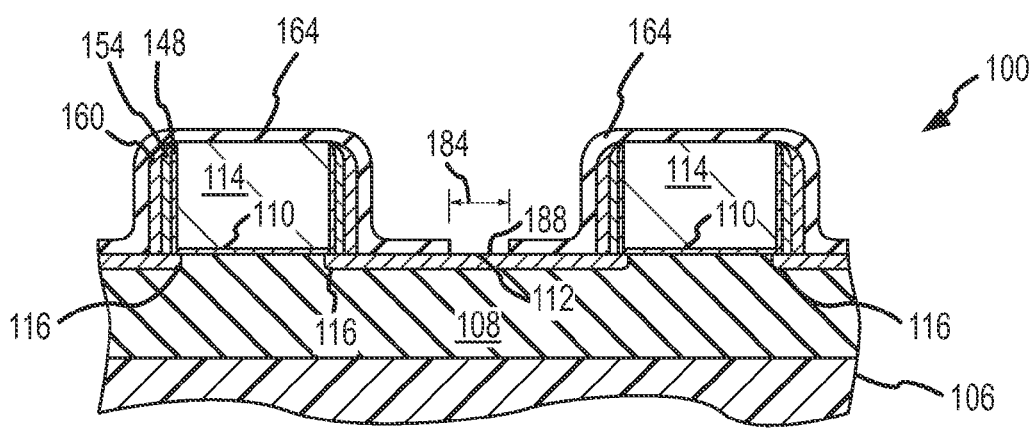

In this regard, the method begins with the steps illustrated in FIGS. 1-6 and, after formation of the additional spacer 160, dielectric material layer 164 is deposited overlying MOS structure 100, as illustrated in FIG. 15. A layer of photoresist 166 is patterned to form an opening that exposes a portion 182 of dielectric material layer 164. Referring to FIG. 16, following the patterning of photoresist 166, the exposed portion 182 of dielectric material layer 164 is removed such as by etching, for example, by RIE in a $CHF_3$, $CF_4$, or $SF_6$ chemistry to form an opening 188 that exposes surface 112 of semiconductor substrate 106. The photoresist then can be removed.

Figure 17:
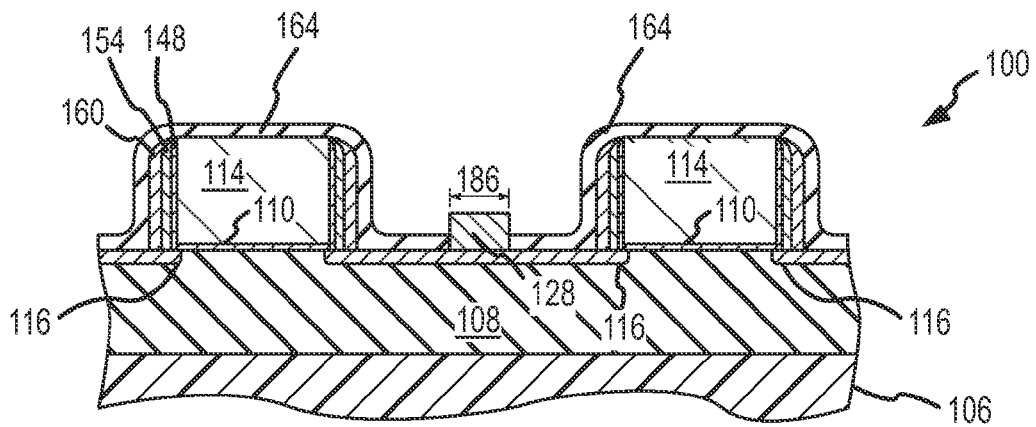

The method continues, in accordance with an exemplary embodiment of the present invention, with the epitaxial growth of silicon on the exposed silicon surface 112, thus forming contact projection 128, as illustrated in FIG. 17. The contact projection can be grown to any thickness desired for a particular device design or application. In an exemplary embodiment, the contact projection 128 is grown to a thickness in the range of about 30 nm to about 50 nm. Referring momentarily to FIGS. 15 and 17, a width, indicated by double-headed arrow 184, of opening 188 is substantially the same as a width, indicated by double-headed arrow 186, of subsequently-formed contact projection 128. Thus, the width of contact projection 128 can be made larger or smaller by adjusting the width of opening 182.

Figure 18:
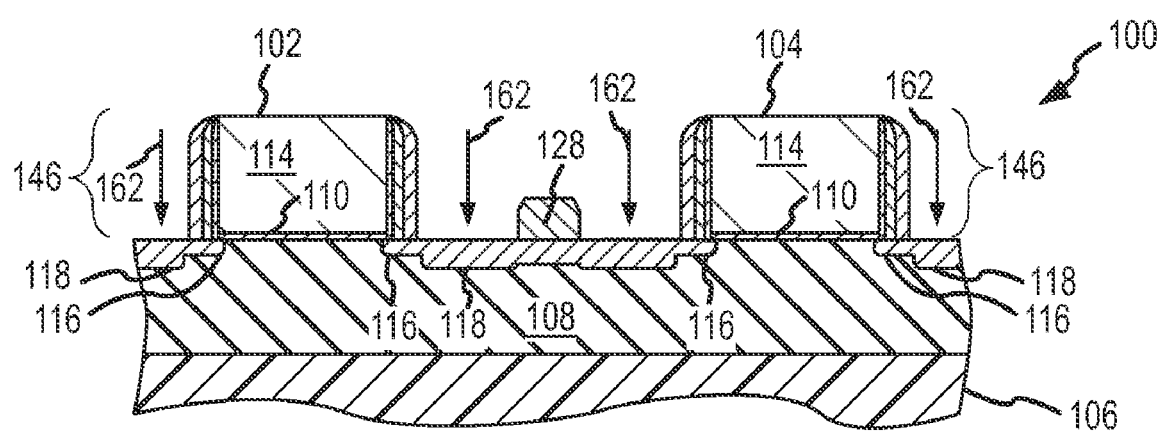
Figure 19:
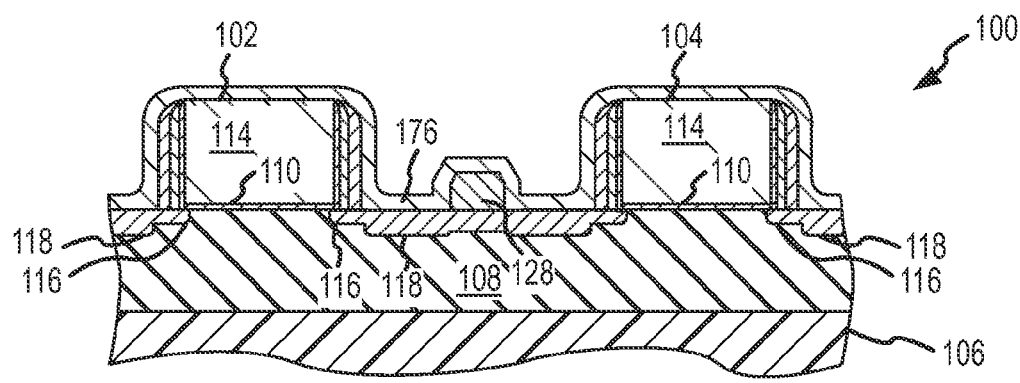
Figure 20:
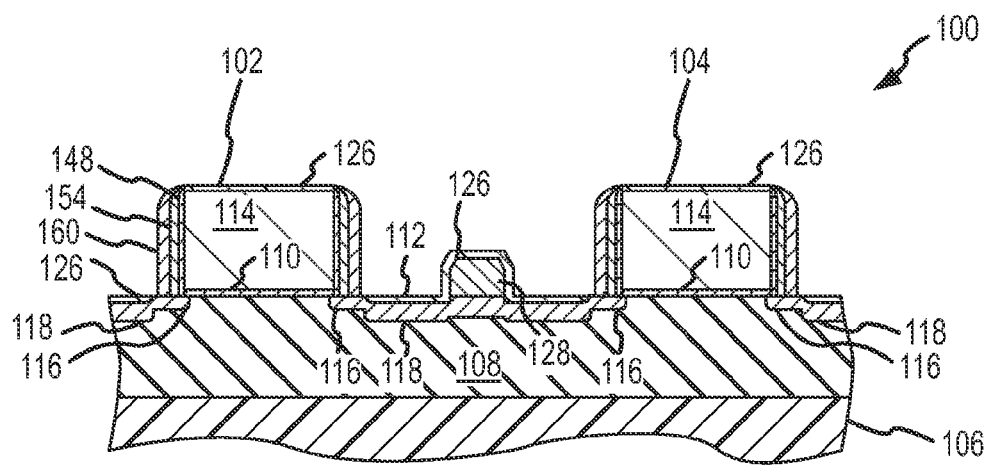
Figure 21:
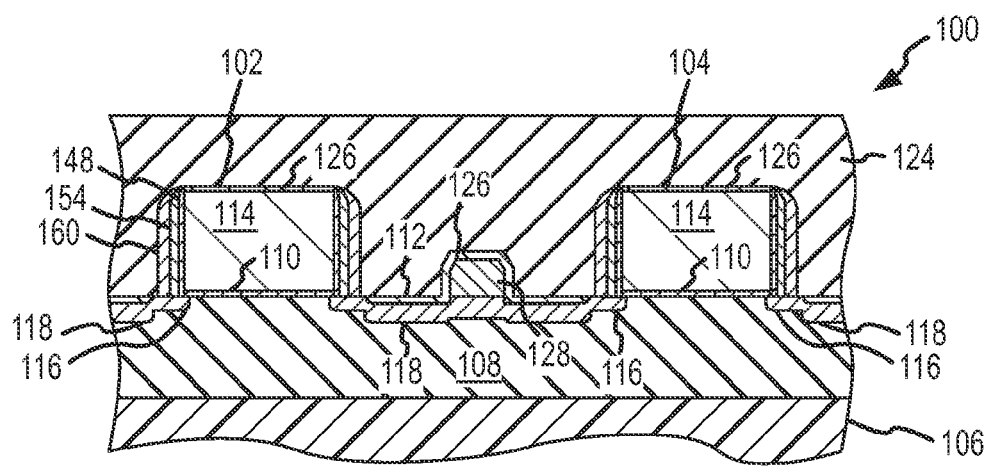

After formation of contact projection 128, dielectric material layer 164 is removed and the gate stacks 146, the reoxidation sidewall spacers, the offset spacers 154, and additional spacers 160 are used as an ion implantation mask to form source and drain regions 118 in silicon substrate 106, thus forming MOS transistors 102 and 104, as illustrated in FIG. 18. The source and drain regions are formed as described above by ion implantation of dopant ions 162 and subsequent thermal annealing. During formation of the source and drain regions 118, contact projection 128 also is impurity doped by implantation of dopant ions 162 and is doped with the same concentration of dopant ions as the source and drain regions 118. Referring to FIG. 19, a blanket layer 176 of silicide-forming metal is deposited overlying MOS structure 100. The silicide-forming metal layer 176 is heated, for example by RTA, to form a metal silicide layer 126 on contact projection 128 and on surface 112 of substrate 106, as well as metal silicide layers 126 on gate electrodes 116, as illustrated in FIG. 20. In an alternative embodiment, the hard mask used to form gate stack 146 as illustrated in FIG. 2 is not removed after formation of the gate stacks so that formation of a metal silicide layer on the gate electrodes is prevented. Any silicide-forming metal that does not react with silicon during the RTA to form a silicide may subsequently be removed by wet etching in a $H_2O_2/H_2SO_4$ or $HNO_3/HCl$ solution. Dielectric material layer 124 then is deposited overlying MOS transistors 102 and 104 and contact projection 128, as illustrated in FIG. 21.

Figure 22:
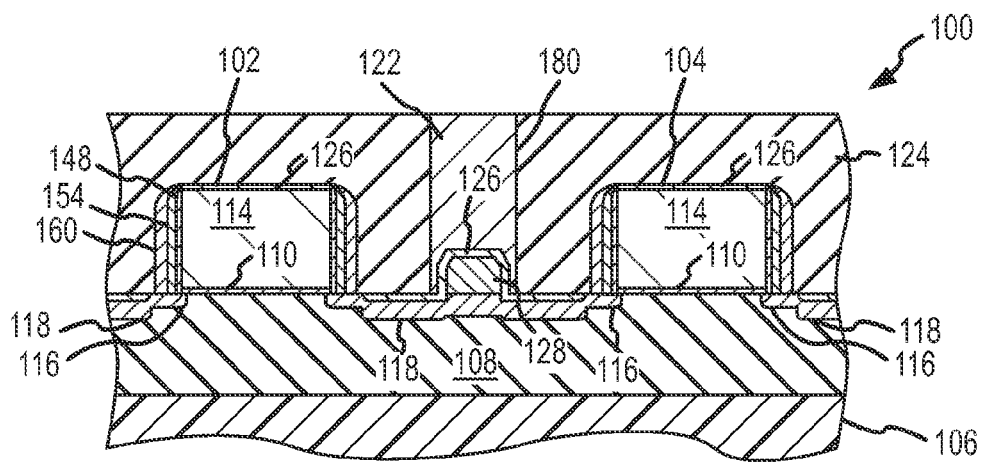

Referring to FIG. 22, the dielectric material layer 124 is photolithographically patterned and etched to form contact opening 180 extending through dielectric material layer 124 and exposing at least a portion of metal silicide layer 126 on contact projection 128. The dielectric material layer may be planarized by a CMP process before patterning. Conductive contact 122 is formed in contact opening 180 so that the source and drain regions can be appropriately connected electrically to other devices in the integrated circuit to implement the desired circuit function. The conductive contact 122 can be formed as described above with reference to FIG. 14.

FIGS. 23-31 illustrate, in cross section, a method for forming an MOS structure, such as MOS structure 100 of FIG. 14, in accordance with yet another exemplary embodiment of the invention. The method illustrated in FIGS. 23-31 is different from the methods illustrated in FIGS. 1-14 and FIGS. 15-22 as, in the method illustrated in FIGS. 23-31, the contact projection is formed before, rather than after, fabrication of MOS transistors.

Figure 23:
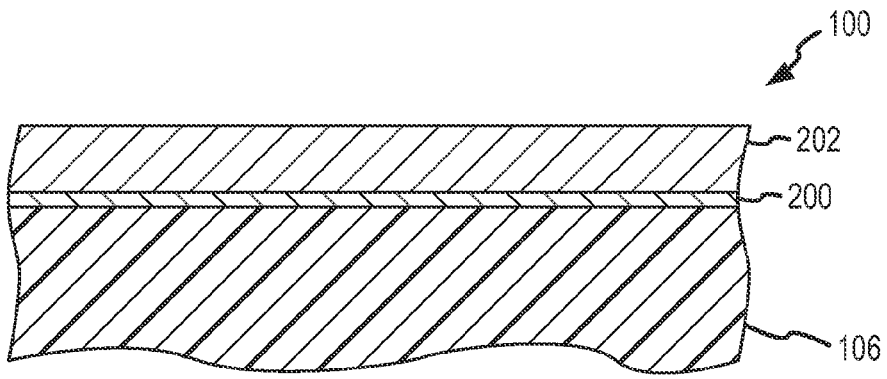
FIGS. 23-31 illustrate, in cross section, a method for fabricating an MOS structure in accordance with a further exemplary embodiment of the present invention.

Referring to FIG. 23, the method begins by forming a first insulating material layer 200 overlying semiconductor substrate 106. The first insulating material layer 200 may comprise, for example, silicon dioxide having a thickness of about 10 nm. A second insulating material layer 202 such as, for example, a silicon nitride layer, is deposited overlying first insulating material layer 200. Second insulating material may have a thickness of, for example, about 100 nm.

Figure 24:
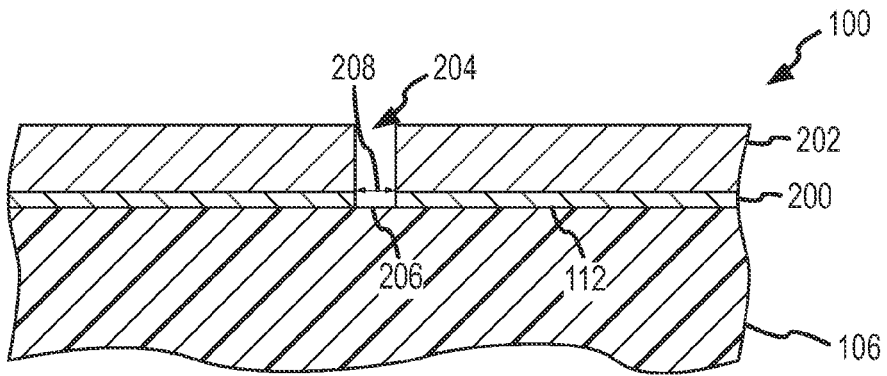

First insulating material layer 200 and second insulating material layer 202 are etched to form an opening 204 extending through the insulating material layers and exposing a portion 206 of surface 112 of substrate 106 as illustrated in FIG. 24. The first insulating material layer 200 and the second insulating material layer 202 can be etched, for example, by RIE in a $CHF_3$, $CF_4$, or $SF_6$ chemistry.

Figure 25:
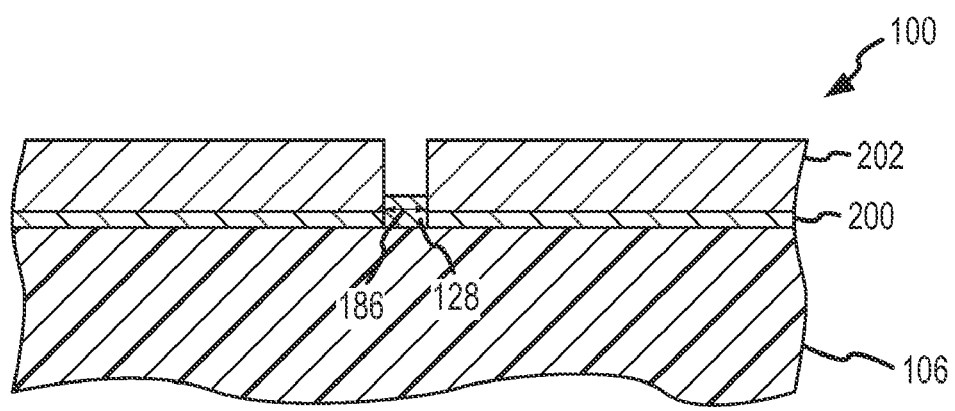
Figure 26:
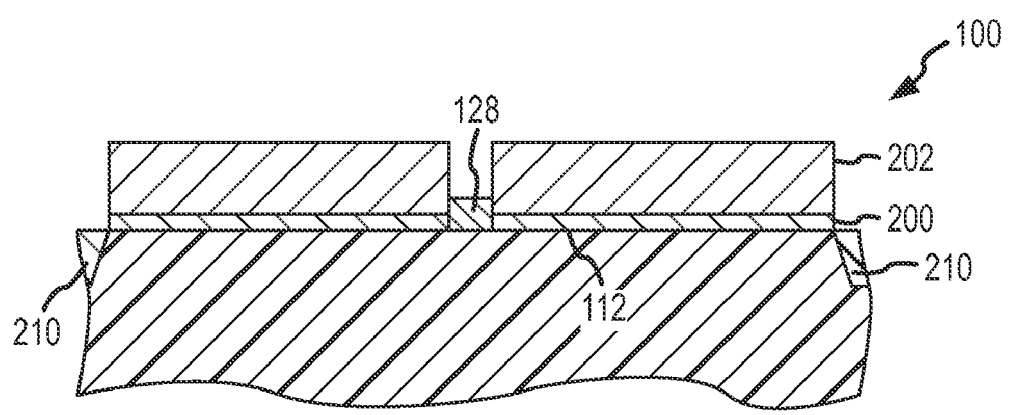
Figure 27:
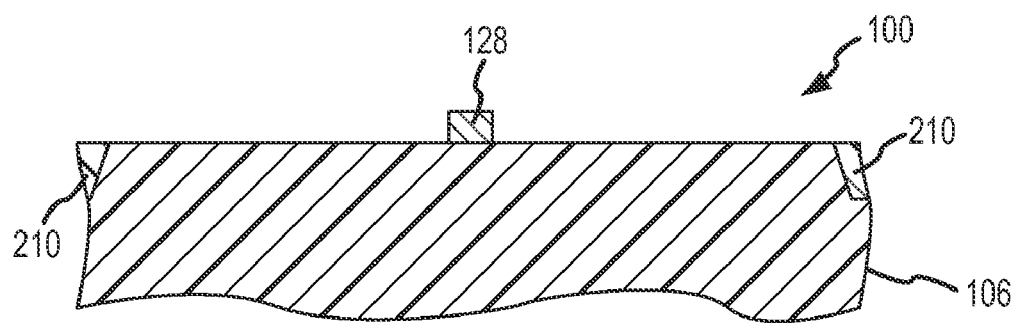

Referring to FIG. 25, in accordance with an exemplary embodiment of the present invention, silicon is epitaxially grown on the exposed silicon surface 112, thus forming contact projection 128. The contact projection can be grown to any thickness desired for a particular device design or application. In an exemplary embodiment, the contact projection 128 is grown to a thickness in the range of about 30 nm to about 50 nm. Referring momentarily to FIGS. 24 and 25, in one exemplary embodiment, opening 204 has a width, indicated by double-headed arrow 208, that is substantially equal to a width, indicated by double-headed arrow 186, of subsequently formed contact projection 128, described below. As illustrated in FIG. 26, after formation of contact projection 128, the first insulating material layer 200, the second insulating material layer 202, and the substrate can be patterned to form shallow trench isolation (STI) 210 in the semiconductor substrate 106 to electrically isolate individual devices as required by the circuit function being implemented. In one exemplary embodiment, a thin dielectric layer (not shown) may be formed overlying layer 202 and silicon projection 128 prior to STI patterning to protect silicon projection 128 during the patterning. The thin dielectric layer may comprise, for example, silicon nitride (SiN) having a thickness of about 20 nm. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material, the surface is usually planarized, for example by chemical mechanical planarization (CMP). The first insulating material layer 200 and the second insulating material layer 202 then are removed, as illustrated in FIG. 27, thus exposing semiconductor substrate 106.

Figure 28:
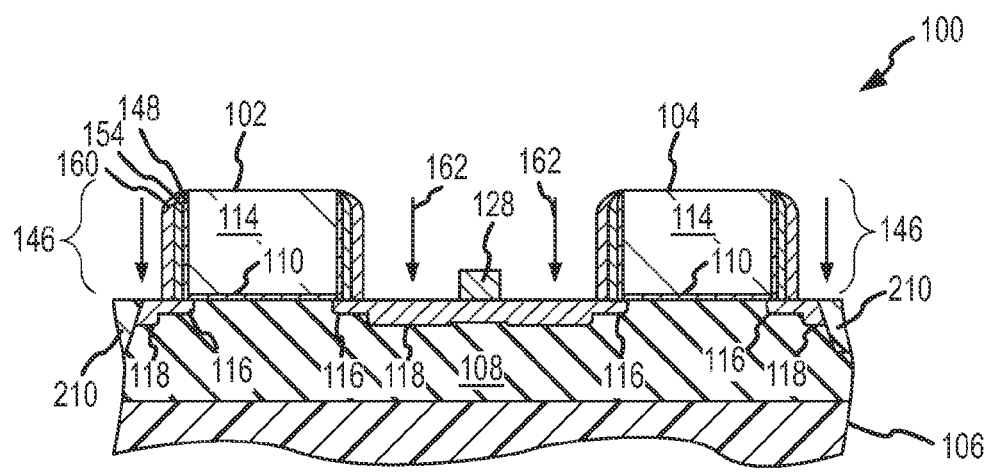

The method continues, in accordance with an exemplary embodiment of the present invention, with the steps described above with reference to FIGS. 1-6 so that contact projection 128 is disposed between two gate stacks 146 that have been used as an ion implantation mask for the formation of source/drain extensions 116, as illustrated in FIG. 28. The gate stacks 146, the reoxidation sidewall spacers 148, the offset spacers 154, and additional spacers 160 then are used as an ion implantation mask to form source and drain regions 118 in silicon substrate 106, thus forming MOS transistors 102 and 104. The source and drain regions are formed by appropriately impurity doping silicon substrate 106 in known manner, for example, by ion implantation of dopant ions, illustrated by arrows 162, and subsequent thermal annealing. During formation of the source and drain regions 118, contact projection 128 also is impurity doped by implantation of dopant ions 162 and is doped with the same concentration of dopant ions as the source and drain regions 118.

Figure 29:
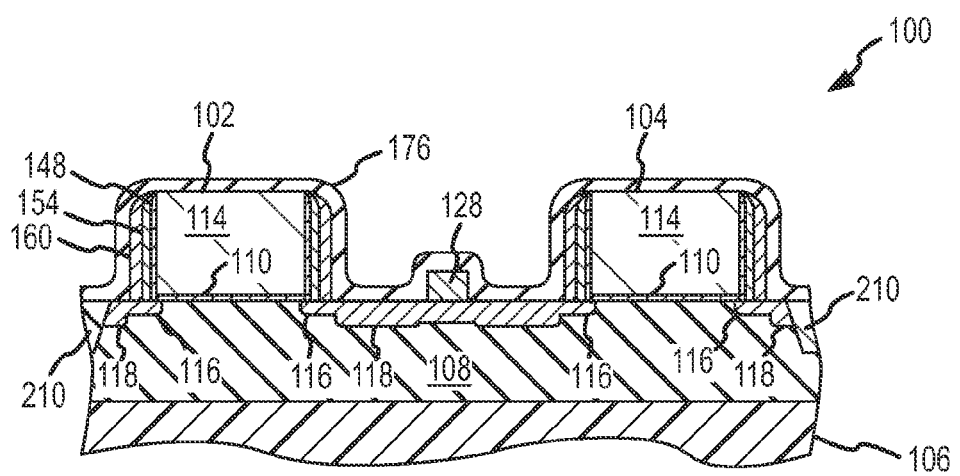
Figure 30:
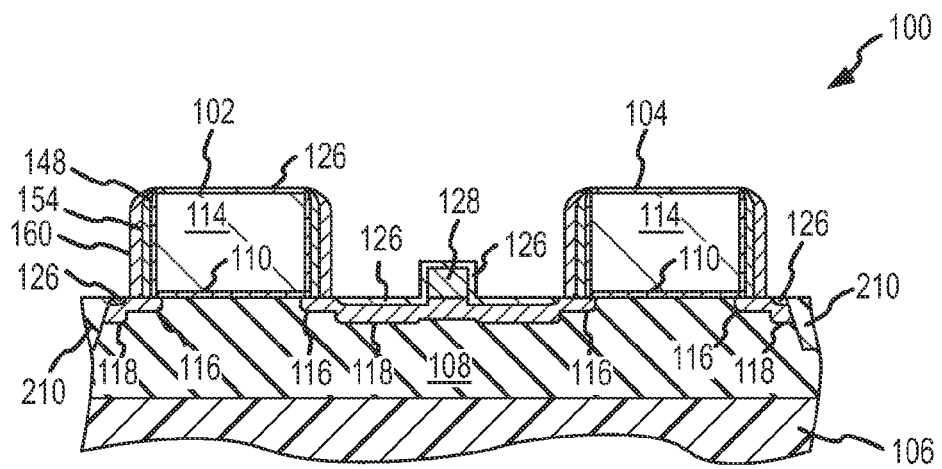

A blanket layer 176 of silicide-forming metal is deposited overlying MOS structure 100, as illustrated in FIG. 29. The silicide-forming metal layer 176 is heated to form metal silicide layer 126 on contact projection 128 and on surface 112 of substrate 106, as well as metal silicide layers 126 on gate electrodes 116, as illustrated in FIG. 30. Again, in an alternative embodiment, the hard mask used to form gate stack 146 is not removed after formation of the gate stacks so that formation of a metal silicide layer on the gate electrodes is prevented. Any un-reacted silicide-forming metal, for example the silicide-forming metal that is deposited on additional spacer 160, may subsequently be removed.

Figure 31:
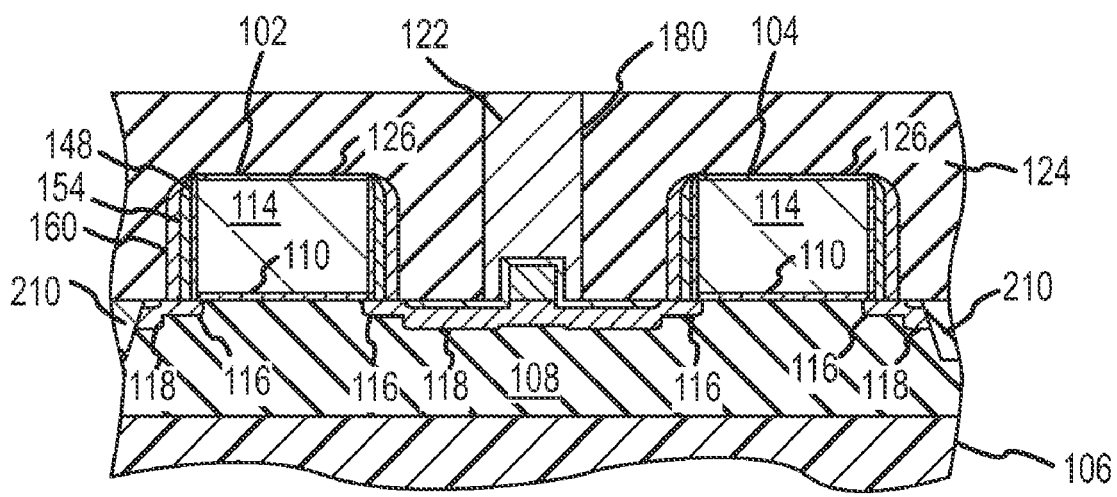

Referring to FIG. 31, and as described above, dielectric material layer 124 is deposited overlying MOS transistors 102 and 104 and contact projection 128. The dielectric material layer 124 is photolithographically patterned and etched to form contact opening 180 extending through dielectric material layer 124 and exposing at least a portion of metal silicide layer 126 on contact projection 128. Conductive contact 122 may be formed using any of the processes described above for the formation of conductive contact 122 with reference to FIG. 14.

Accordingly, MOS structures that exhibit low contact resistance have been provided. The MOS structures comprise a contact projection that allows for an increase in the surface area of the interface between a conductive contact and a metal silicide layer that is electrically coupled to source and drain regions of an MOS device. Because a large part of the contact resistance is due to the barrier layer material at the interface of the contact and the metal silicide layer (for example, because the resistivity of a TiN/Ti barrier layer combination is much higher than that of a tungsten contact), increasing the interface area results in an effective reduction of contact resistance. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating an MOS structure, the method comprising:
    providing a semiconductor substrate;
    fabricating a gate stack on the semiconductor substrate;
    forming a first mask overlying the semiconductor substrate, the first mask having an opening;
    epitaxially growing semiconductor material on the semiconductor substrate within the opening;
    forming a second mask overlying the semiconductor material;
    etching the epitaxially grown semiconductor material using the second mask as an etch mask to form a contact projection on the semiconductor substrate;
    removing the second mask;
    removing the first mask;
    implanting ions of a conductivity-determining type within the semiconductor substrate using the gate stack as an ion implantation mask to form impurity-doped regions within the semiconductor substrate;
    forming a metal silicide layer on the contact projection; and
    forming a contact to the metal silicide layer,
    wherein the contact is in electrical communication with the impurity-doped regions via the contact projection.

2. The method of claim 1, wherein the step of etching the insulating material to form the opening therein comprises the step of etching the insulating material so that the opening has a width that is substantially equal to a width of the contact projection.

3. The method of claim 1, wherein the step of implanting ions comprises implanting ions into the contact projection.

4. The method of claim 1, wherein the step of implanting ions comprises implanting ions into the contact projection after the step of etching the epitaxially grown semiconductor material.

5. The method of claim 1, wherein the step of fabricating the gate stack on the semiconductor substrate is performed after the step of forming the contact projection on the semiconductor substrate.

6. The method of claim 5, wherein the step of forming the contact projection comprises the steps of:
    depositing an insulating material layer on the semiconductor substrate;
    etching the insulating material layer to form an opening and to expose the semiconductor substrate; and
    epitaxially growing semiconductor material on the semiconductor substrate and within the opening.

7. The method of claim 6, wherein the step of etching the insulating material layer to form the opening therein comprises the step of etching the insulating material layer so that the opening has a width that is substantially equal to a width of the contact projection.

8. The method of claim 6, farther comprising, after the step of epitaxially growing, the steps of:
    forming shallow trench isolation regions within the semiconductor substrate; and
    removing the insulating material layer.

9. The method of claim 1, wherein the step of forming a contact projection comprises forming a contact projection having a thickness in the range of about 20 nm to about 50 nm.

10. A method for fabricating an MOS structure, the method comprising:
    providing a silicon substrate;
    forming a gate stack on the silicon substrate;
    forming a mask layer overlying the silicon substrate, the mask layer having an opening that exposes a surface of the silicon substrate;
    fabricating a contact projection on the surface of the silicon substrate and within the opening, the contact projection having a first area in contact with the surface of the substrate; removing the mask layer;
    forming a metal silicide on the contact projection;
    depositing a dielectric material overlying the contact projection;
    etching a contact opening through the dielectric material to the metal silicide on the contact projection; and
    forming a contact in the contact opening on the metal silicide, wherein an interface between the metal silicide and the contact is greater than the first area.

11. The method of claim 10, further comprising, after the step of fabricating the contact projection on the surface of the silicon substrate and before the step of forming the metal silicide on the contact projection, the step of implanting ions of a conductivity-determining type within the contact projection and the silicon substrate.

12. The method of claim 10, wherein the step of fabricating the contact projection on the surface of the silicon substrate comprises epitaxially growing silicon on the silicon substrate within the opening.

13. The method of claim 12, wherein the step of forming the opening comprises the step of forming the opening so that it has a width that is substantially equal to a width of the contact projection.

14. The method of claim 10, wherein the step of forming the gate stack on the silicon substrate is performed after the step of fabricating the contact projection on the surface of the silicon substrate.

15. The method of claim 14, wherein the step of fabricating the contact projection comprises the steps of:
    depositing a layer of silicon dioxide on the silicon substrate;
    depositing a layer of silicon nitride on the layer of silicon dioxide;
    etching an opening within the layer of silicon nitride and the layer of silicon dioxide to expose the silicon substrate; and
    epitaxially growing silicon on the silicon substrate within the opening.

16. The method of claim 15, wherein the step of etching the opening comprises the step of forming the opening so that it has a width that is substantially equal to a width of the contact projection.

17. The method of claim 15, further comprising, after the step of epitaxially growing, the step of forming shallow trench isolations regions within the silicon substrate.

18. The method of claim 10, wherein the step of forming a gate stack is performed after the step of fabricating a contact projection.

* * * * *